(12) United States Patent
Blanchard et al.

(10) Patent No.: US 11,777,018 B2
(45) Date of Patent: Oct. 3, 2023

(54) LAYOUT TO REDUCE CURRENT CROWDING AT ENDPOINTS

(71) Applicant: IDEAL POWER INC., Austin, TX (US)

(72) Inventors: Richard A. Blanchard, Los Altos, CA (US); Alireza Mojab, Austin, TX (US)

(73) Assignee: IDEAL POWER INC., Austin, TX (US)

( * ) Notice: Subject to any disclaimer, the term of this patent is extended or adjusted under 35 U.S.C. 154(b) by 101 days.

(21) Appl. No.: 17/523,513

(22) Filed: Nov. 10, 2021

(65) Prior Publication Data

US 2022/0157974 A1    May 19, 2022

Related U.S. Application Data

(60) Provisional application No. 63/116,078, filed on Nov. 19, 2020.

(51) Int. Cl.
*H01L 29/06* (2006.01)
*H01L 29/732* (2006.01)

(52) U.S. Cl.
CPC ................................ *H01L 29/732* (2013.01)

(58) Field of Classification Search
CPC ............... H01L 29/732; H01L 29/0692; H01L 29/42304
USPC ....................................................... 438/205
See application file for complete search history.

(56) References Cited

U.S. PATENT DOCUMENTS

| 5,352,924 A | 10/1994 | Mahant-Shetti |
| 5,532,924 A * | 7/1996 | Hara ..................... G05B 19/425 700/47 |
| 6,891,250 B1 * | 5/2005 | Sakamoto ........... H01L 29/7322 257/E29.183 |
| 9,029,909 B2 | 5/2015 | Blanchard et al. |
| 9,035,350 B2 | 5/2015 | Blanchard et al. |
| 9,054,706 B2 | 6/2015 | Blanchard et al. |

(Continued)

FOREIGN PATENT DOCUMENTS

| CN | 105308750 A | 2/2016 |
| EP | 2954557 B1 | 12/2015 |

(Continued)

OTHER PUBLICATIONS

International Search Report and Written Opinion of PCT/US2021/58915, dated Feb. 3, 2022.

(Continued)

*Primary Examiner* — Sheikh Maruf
(74) *Attorney, Agent, or Firm* — Dickinson Wright PLLC; Mark E. Scott (57) ABSTRACT

Layout to reduce current crowding at endpoints. At least one example is a semiconductor device comprising: an emitter region defining an inner boundary in the shape of an obround with parallel sides, and the obround having hemispherical ends each having a radius; a base region having a first end, a second end opposite the first end, and base length, the base region disposed within the obround with the base length parallel to and centered between the parallel sides, the first end spaced apart from the first hemispherical end by a first gap greater than the radius, and the second end spaced apart from the second hemispherical ends by a second gap greater than the radius.

20 Claims, 7 Drawing Sheets

(56) References Cited

U.S. PATENT DOCUMENTS

| | | | |
|---|---|---|---|
| 9,054,707 B2 | 6/2015 | Blanchard et al. | |
| 9,059,710 B2 | 6/2015 | Blanchard et al. | |
| 9,190,894 B2 | 11/2015 | Blanchard et al. | |
| 9,203,400 B2 | 12/2015 | Blanchard et al. | |
| 9,203,401 B2 | 12/2015 | Blanchard et al. | |
| 9,209,713 B2 | 12/2015 | Blanchard et al. | |
| 9,209,798 B2 | 12/2015 | Blanchard et al. | |
| 9,231,582 B1 | 1/2016 | Blanchard et al. | |
| 9,337,262 B2 | 5/2016 | Blanchard et al. | |
| 9,355,853 B2 | 5/2016 | Blanchard et al. | |
| 9,356,595 B2 | 5/2016 | Blanchard et al. | |
| 9,369,125 B2 | 6/2016 | Blanchard et al. | |
| 9,374,084 B2 | 6/2016 | Blanchard et al. | |
| 9,374,085 B2 | 6/2016 | Blanchard et al. | |
| 9,444,449 B2 | 9/2016 | Bundschuh et al. | |
| 9,614,028 B2 | 4/2017 | Blanchard et al. | |
| 9,647,553 B2 | 5/2017 | Blanchard et al. | |
| 9,660,551 B2 | 5/2017 | Blanchard et al. | |
| 9,679,999 B2 | 6/2017 | Blanchard et al. | |
| 9,742,385 B2 | 8/2017 | Alexander | |
| 9,755,018 B2 | 9/2017 | Cheng et al. | |
| 9,786,773 B2 | 10/2017 | Blanchard et al. | |
| 9,787,298 B2 | 10/2017 | Blanchard et al. | |
| 9,787,304 B2 | 10/2017 | Blanchard et al. | |
| 9,799,731 B2 * | 10/2017 | Alexander | H01L 29/7375 |
| 9,818,615 B2 | 11/2017 | Blanchard et al. | |
| 9,899,868 B2 | 2/2018 | Blanchard et al. | |
| 9,900,002 B2 | 2/2018 | Blanchard et al. | |
| 10,056,372 B2 | 8/2018 | Alexander | |
| 10,211,283 B2 | 2/2019 | Blanchard et al. | |
| 10,418,471 B2 | 9/2019 | Blanchard et al. | |
| 10,497,699 B2 | 12/2019 | Blanchard et al. | |
| 10,580,885 B1 | 3/2020 | Blanchard et al. | |
| 10,892,354 B2 | 1/2021 | Blanchard et al. | |
| 2005/0212088 A1 * | 9/2005 | Akaki | H01L 29/732 257/E29.183 |
| 2009/0029510 A1 * | 1/2009 | Kerr | H01L 27/0928 438/234 |
| 2010/0173459 A1 * | 7/2010 | Kerr | H01L 21/8249 438/204 |
| 2013/0146894 A1 * | 6/2013 | Cheng | H01L 29/732 257/E29.174 |
| 2015/0123246 A1 * | 5/2015 | Hu | H01L 21/8249 257/584 |
| 2016/0005732 A1 * | 1/2016 | Wood | H01L 29/0804 257/163 |
| 2016/0093722 A1 * | 3/2016 | Tilke | H01L 21/76224 257/51 |
| 2016/0344300 A1 | 11/2016 | Alexander | |
| 2017/0179239 A1 * | 6/2017 | Nitta | H01L 21/823892 |
| 2017/0179267 A1 * | 6/2017 | Hikasa | H01L 29/456 |
| 2017/0287721 A1 | 10/2017 | Wood | |
| 2018/0130898 A1 | 5/2018 | Blanchard et al. | |
| 2019/0043969 A1 | 2/2019 | Wood | |
| 2019/0363196 A1 | 11/2019 | Wood | |
| 2020/0111672 A1 * | 4/2020 | Blanchard | H01L 29/7397 |
| 2020/0321455 A1 | 10/2020 | Wood | |

FOREIGN PATENT DOCUMENTS

| | | |
|---|---|---|
| GB | 2510716 A | 8/2014 |
| GB | 2524699 A | 9/2015 |
| GB | 2546475 A | 7/2017 |
| GB | 2572702 A | 10/2019 |
| TW | 201834373 A | 9/2018 |
| WO | 2014122472 A1 | 8/2014 |
| WO | 2018109452 A1 | 6/2018 |

OTHER PUBLICATIONS

"B-Tran—Bi-Directional Bi-Polar Junction TRANsistor"; White Paper (2), Apr. 2016, idealpower.com, p. 1-11.

* cited by examiner

LAYOUT TO REDUCE CURRENT CROWDING AT ENDPOINTS

CROSS-REFERENCE TO RELATED APPLICATIONS

This application claims the benefit of U.S. Provisional App. No. 63/116,078 filed Nov. 19, 2020 titled "Layout Design to Mitigate Current Crowding at the Device Endpoints." The provisional application is incorporated by reference herein as if reproduced in full below.

BACKGROUND

A bidirectional bipolar junction transistor (hereafter B-TRAN) is junction transistor constructed with a base and collector-emitter on a first side of the bulk region, and a distinct and separate base and collector-emitter on a second side of the bulk region opposite the first side. When properly configured by an external driver, electrical current may selectively flow through a B-TRAN in either direction, and thus B-TRAN devices are considered bidirectional devices. Based on the bi-directionality, whether a collector-emitter is considered a collector (e.g., current flow into the B-TRAN) or an emitter (e.g., current flow out of the B-TRAN) depends on the applied external voltage and thus the direction of current flow through the B-TRAN.

For NPN-type devices, the collector-emitter region on each side of the semiconductor substrate can be considered to form a PN junction with the bulk region. One manufacturing performance test is to determine the reverse-bias breakdown voltage of the PN junction on each side of the semiconductor substrate. If the reverse breakdown voltage of the PN junction is too low, the overall performance of the B-TRAN may be degraded.

SUMMARY

One example is a semiconductor device comprising: an emitter region defining an inner boundary in the shape of an obround with parallel sides, and the obround having a first hemispherical end and a second hemispherical end each having a radius; a base region having a first end, a second end opposite the first end, and base length, the base region disposed within the obround with the base length parallel to and centered between the parallel sides, the first end spaced apart from the first hemispherical end by a first gap greater than the radius by more than a manufacturing tolerance, and the second end spaced apart from the second hemispherical end by a second gap greater than the radius by more than the manufacturing tolerance.

In the example semiconductor device, the first gap may be at least fifty percent (50%) longer than the radius. In the example semiconductor device, the first gap may be is at least one hundred percent (100%) longer than the radius.

The example semiconductor device may further comprise: a base contact electrically coupled to the base region through a base window through a dielectric, the base contact defines a length parallel to the base length, and a first terminus being a closest terminus to the first end, the first terminus spaced apart from the first end by a setback distance being at least equal to the radius. The setback distance may be at least fifty percent (50%) longer than the radius. The setback distance may be at least one hundred percent (100%) longer than the radius.

The example semiconductor device may further comprise a lower side comprising an emitter region and a base region, and the semiconductor device may define a bidirectional double-base bipolar junction transistor.

In the example semiconductor device the base region may be P-type, and the emitter region may be N-type.

The example semiconductor device may further comprise a trench of dielectric material surrounding the base region. The trench may have a depth of 10 microns to 15 microns, inclusive, and a width of 3 microns to 5 microns, inclusive.

A second example semiconductor device may comprise: an emitter region defining an inner boundary in the shape of an obround with parallel sides, and the obround having first and second hemispherical ends each having a radius; a base region having a first end, a second end opposite the first end, and base length, the base region disposed within the obround with the base length parallel to and centered between the parallel sides, the first end spaced apart from the first hemispherical end by a first gap, and the second end spaced apart from the second hemispherical end by a second gap; a base contact electrically coupled to the base region, the base contact defines a length parallel to the base length, and a first terminus being a closest terminus to the first end, the first terminus spaced apart from the first end by a setback distance being at least equal to the radius.

In the second example semiconductor device, the setback distance may be at least fifty percent (50%) longer than the radius. In the second example semiconductor device, the setback distance may be is at least one hundred percent (100%) longer than the radius.

In the second example semiconductor device, the first gap may be greater than the radius by more than a manufacturing tolerance, and the second gap greater than the radius by more than a manufacturing tolerance. The first gap may be at least fifty percent (50%) longer than the radius. Alternatively, the first gap may be at least one hundred percent (100%) longer than the radius.

The second example semiconductor device may further comprise a lower side comprising an emitter region and a base region, and the semiconductor device may define a bidirectional double-base bipolar junction transistor.

In the second example semiconductor device, the base region may be P-type, and the emitter region may be N-type.

The second example semiconductor device may further comprise a trench of dielectric material surrounding the base region. The trench may have a depth of 10 microns to 15 microns, inclusive, and a width of 3 microns to 5 microns, inclusive.

BRIEF DESCRIPTION OF THE DRAWINGS

For a detailed description of example embodiments, reference will now be made to the accompanying drawings in which.

DEFINITIONS

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

"About" in reference to a recited parameter shall mean the recited parameter plus or minus ten percent (+/−10%) of the recited parameter.

"Bidirectional double-base bipolar junction transistor" shall mean a junction transistor having a base and a collector-emitter on a first face or first side of a bulk region, and having a base and a collector-emitter on a second face or second side of the bulk region. The base and the collector-emitter on the first side are distinct from the base and the collector-emitter on the second side. An outward pointing vector normal to the first side points an opposite direction to an outward pointing vector normal to the second side.

"Upper base" shall mean a base of a bidirectional double-base bipolar junction transistor on a first side of a bulk region of the transistor, and shall not be read to imply a location of the base with respect to gravity.

"Lower base" shall mean a base of a bidirectional double-base bipolar junction transistor on a second side of a bulk region of the transistor opposite a first side, and shall not be read to imply a location of the base with respect to gravity.

"Upper collector-emitter" shall mean a collector-emitter of a bidirectional double-base bipolar junction transistor on a first side of a bulk region of the transistor, and shall not be read to imply a location of the collector-emitter with respect to gravity.

"Lower collector-emitter" shall mean a collector-emitter of a bidirectional double-base bipolar junction transistor on a second side of a bulk region of the transistor opposite a first side, and shall not be read to imply a location of the collector-emitter with respect to gravity.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various examples are directed to a layout to reduce current crowding at endpoints of structures within semiconductor device, such as bidirectional double-base bipolar junction transistors (B-TRANs). In particular, in example systems each emitter region defines an emitter area with an inner boundary in the shape of an obround having straight sides and hemispherical ends. A base region is disposed within the obround, the base region having a base length and on opposite ends. In example systems, the ends of the base region each have an offset or gap from the respective hemispherical ends by a distance greater than the radius of the hemispherical ends. The gap reduces current crowding at the ends of the base region, which reduced current crowding results lower electric fields at the ends of the base region and thus greater reverse-bias breakdown voltage of the junction formed between the base and the emitter. The specification first turns to an example B-TRAN device to orient the reader.

Figure 1:
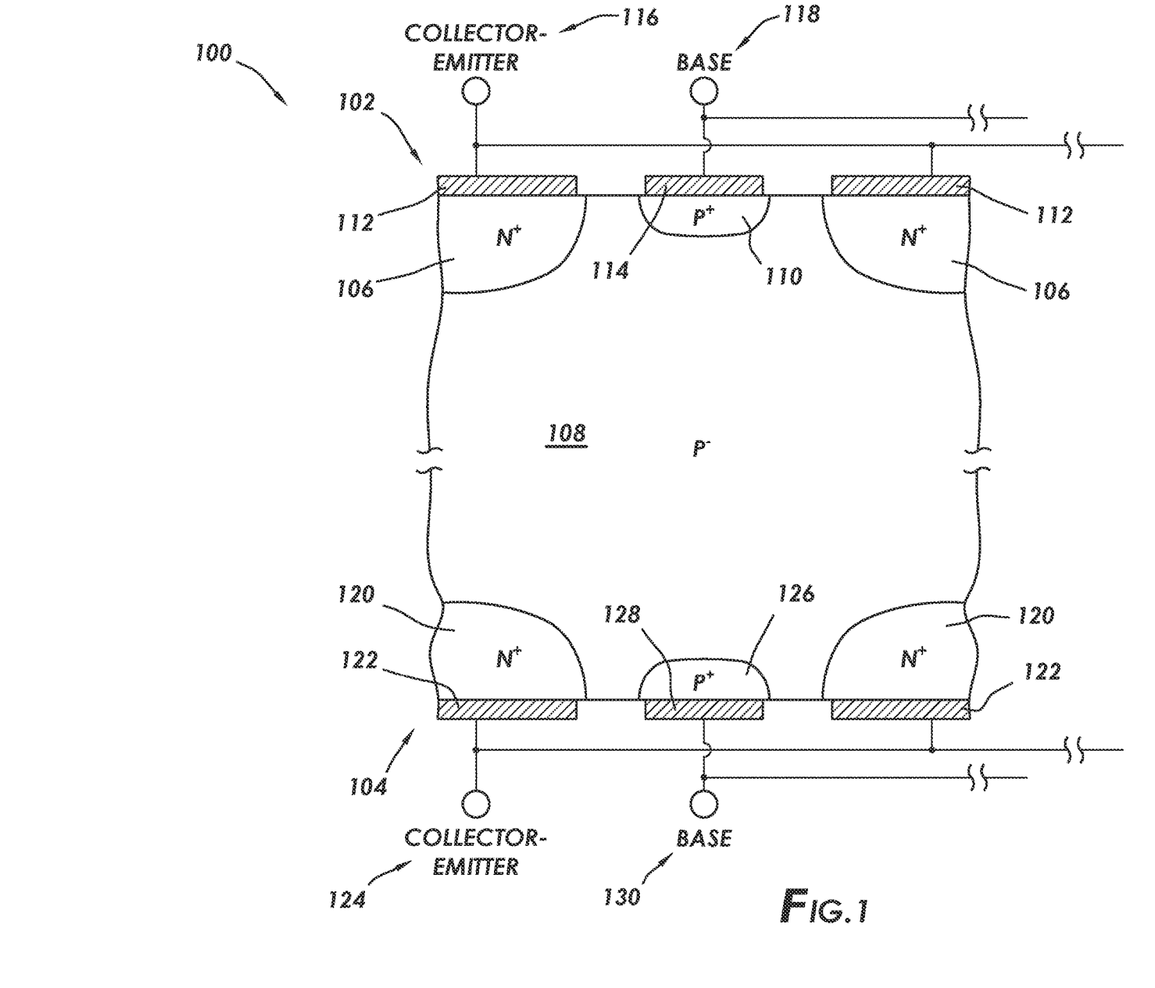
FIG. 1 shows a cross-sectional elevation view of a portion of B-TRAN in accordance with at least some embodiments.

FIG. 1 shows a partial cross-sectional, elevation view of an example B-TRAN. In particular, FIG. 1 shows a B-TRAN 100 having an upper face or upper side 102 and a lower face or lower side 104. The designations "upper" and "lower" are arbitrary and used merely for convenience of the discussion. The upper side 102 faces a direction opposite the lower side 104. Stated differently, an outward pointing vector normal to the average elevation of the upper side 102 (the vector not specifically shown) points an opposite direction with respect to an outward pointing vector normal to the average elevation of the lower side 104 (the vector not specifically shown).

The upper side 102 includes collector-emitter regions 106 which form a junction with the drift region or bulk substrate 108. The upper side 102 further defines a base region 110 disposed between the collector-emitter regions 106. The collector-emitter regions 106 are electrically coupled to collector-emitter contacts 112, such as a metallic material applied through windows in an insulation material (not specifically shown) covering the upper side 102. Similarly, the base region 110 is electrically coupled to a base contact 114, such as a metallic material applied through a window in the insulation material (not specifically shown) covering the upper side 102. In the view of FIG. 1, only two collector-emitter contacts 112 are shown, and only one base contact 114 is shown; however, and as discussed in greater detail below, in example systems two or more collector-emitter contacts 112 may be implemented, and two or more base contacts 114 may be implemented. In example systems, the collector-emitter contacts 112 are coupled together to form an upper collector-emitter 116. The base contacts 114 are coupled together to form an upper base 118.

Similarly, the lower side 104 includes collector-emitter regions 120 which form a junction with the bulk substrate 108, and collector-emitter contacts 122 that electrically couple to the collector-emitter regions 120. The collector-emitter contacts 122 are coupled together to form the lower collector-emitter 124. The lower side 104 includes the base region 126 and a base contact 128 that electrically couples to the base region 126. The base contacts 128 are coupled together to form a lower base 130.

The example B-TRAN 100 is an NPN structure, which means the collector-emitter regions 106 and 120 are N-type, the base regions 110 and 126 are P-type, and the bulk substrate 108 is P-type. Note that PNP-type B-TRAN devices are also contemplated; however, so as not to unduly lengthen the discussion a PNP-type B-TRAN device is not specifically shown.

In example cases, the various structures and doping associated with the upper side 102 are meant to be mirror images of the various structures and doping associated with the lower side 104. However, in some cases the various structures and doping associated with the upper side 102 are constructed at different times than the various structures and doping on the lower side 104, and thus there may be slight differences in the structures and doping as between the two sides. It follows that the differences may be attributable to variation within manufacturing tolerances, but such does not adversely affect the operation of the device as a bidirectional double-base bipolar junction transistor.

Figure 2:
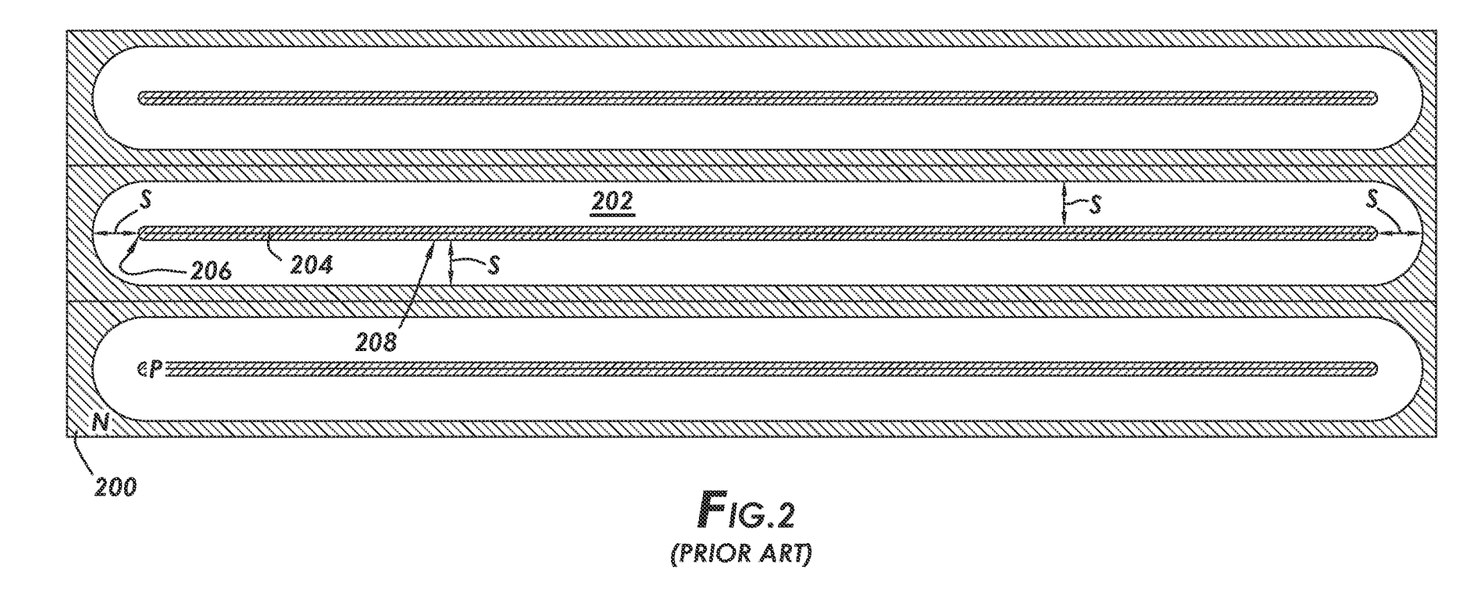
FIG. 2 shows an overhead view of the upper side of a semiconductor substrate during an intermediate stage of the construction of a related-art device.

FIG. 2 shows an overhead view of the upper side of a semiconductor substrate during an intermediate stage of the construction of related-art devices. In particular, visible in FIG. 2 is an emitter region 200. The emitter region 200 defines several internal regions that are not doped as emitter regions, such as internal region 202. Defined within the example internal region 202 is a base region 204. In related-art devices, the separation S between the base region 204 and the surrounding emitter region 200 is uniform as shown. Stated otherwise, the separation S between the ends of the base regions 204 is the same as the separation S along the long dimension of the base region 204.

It turns out, however, that devices constructed with the layout as shown in FIG. 2 have lower than expected reverse-bias breakdown voltage and higher than expected reversed-bias leakage current. Consider, as an example, that the base region 204 is a P-type region, and the emitter region 200 is an N-type region. Thus, though part of a larger overall structure, the base region 204 to the emitter region 200 may be considered to form a PN junction (e.g., a diode). During intermediate stages of manufacturing, various properties of a device may be tested, such as the forward voltage drop and reverse-bias breakdown voltage of the PN junction formed by the base region 204 and the emitter region 200. Testing of a related-art structure with the layout as shown in FIG. 2 indicated lower than expected reverse-bias breakdown voltage and corresponding increase reverse-bias leakage current.

The inventors of the current specification found that the lower than expected reverse-bias breakdown voltage and corresponding increase reverse-bias leakage current is attributable, at least in part, to the layout as between the emitter region 200 and the base region 204. In particular, the inventors of the current specification found that implementing the same separation S at the ends of the base regions 204 (such as at location 206) as implemented along the long dimension of the base region 204 results in increased electrical field strength compared to the straight areas, such as at location 208. Stated otherwise, the uniform spacing S between base region 204 and the emitter region 200 causes current bunching at the ends, such as location 206. The increased electric field strength attributable to the layout results in breakdown at lower than expected reverse-bias voltages. That is, for a particular applied voltage on the base region 204, the electric field strength at the location 206 will be higher than the electrical field strength along the straight portions, such as at location 208. The result is a reverse-bias breakdown voltage lower than desired (e.g., breakdown at 30-40V rather than a designed 60-90V).

Figure 3:
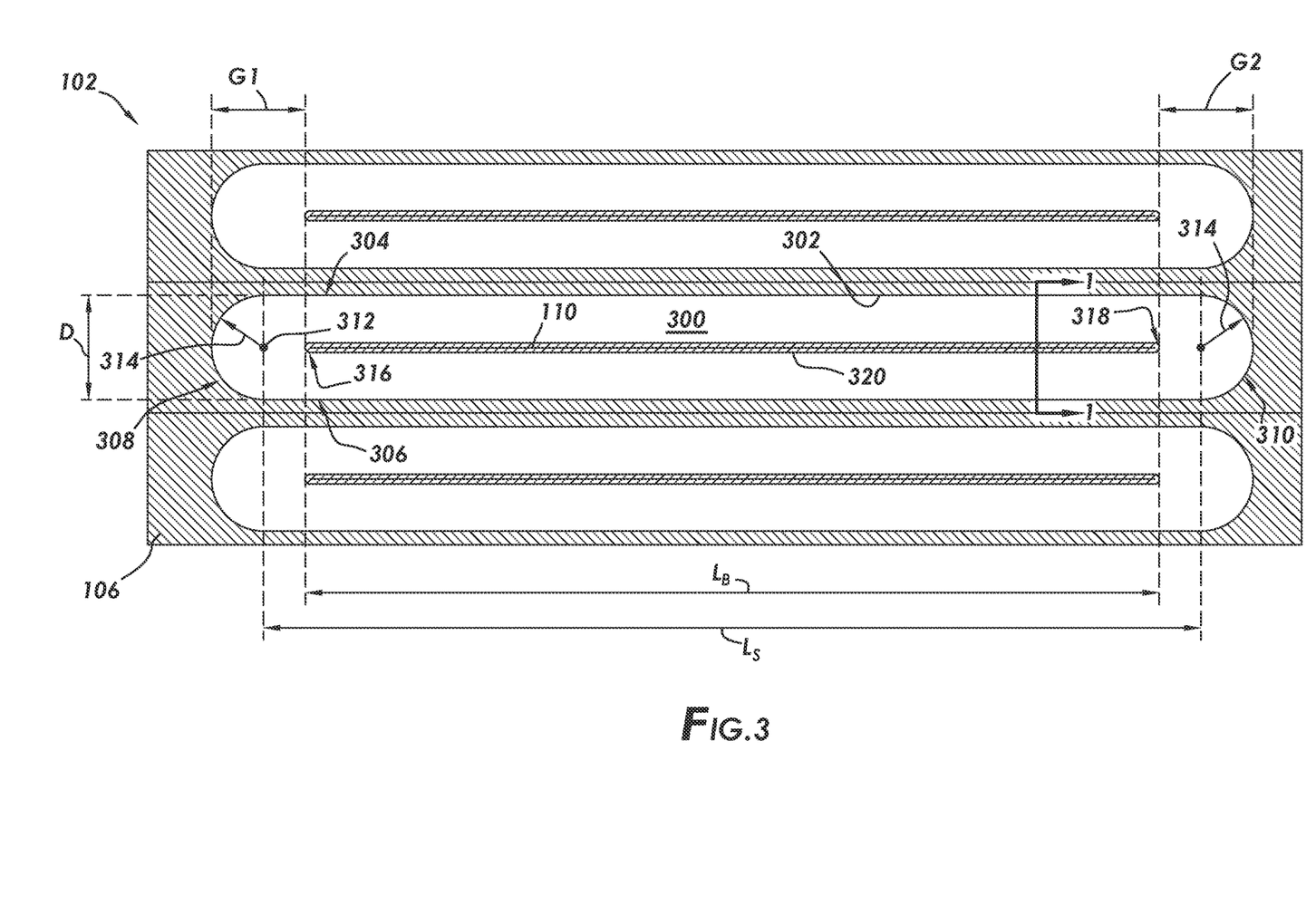
FIG. 3 shows an overhead view of the upper side of a semiconductor substrate during an intermediate stage of the construction, and in accordance with at least some embodiments.

FIG. 3 shows an overhead view of the upper side 102 of a semiconductor substrate during an intermediate stage of the construction, and in accordance with at least some embodiments. Again, showing the upper side 102 is arbitrary, as in symmetrical devices the upper side 102 and lower side 104 (FIG. 1) appear identical. For context, the cross-sectional view of FIG. 1 may be considered to have been taken along line 1-1 of FIG. 3; however, note that FIG. 3 shows the upper side 102 of the semiconductor substrate prior to metal deposition that creates the collector-emitter contacts 112 (FIG. 1) and base contact 114 (FIG. 1).

In particular, visible in FIG. 3 is the collector-emitter region 106. The collector-emitter region 106 defines several internal regions that are not doped as collector-emitter regions, such as internal region 300. Each internal region 300 is defined by an inner boundary of the collector-emitter region 106, such as inner boundary 302. In some cases, the inner-boundary 302 is an internal boundary of the doped region that forms the collector-emitter region 106. In example cases, and as shown, the inner boundary 302 defines a racetrack pattern or obround comprising a first straight side 304 that is parallel to and offset from a second straight side 306. The example straight sides 304 and 306 each define a length Ls along their straight portions, as shown in the figure. The example inner boundary 302 further defines a first hemispherical end 308 and a second hemispherical end 310 opposite the first hemispherical end 308. Referring to hemispherical end 308 as representative, the hemispherical end 308 defines a center of curvature 312 and a radius of curvature 314. That is to say, the radius of curvature 314 sweeps out and defines the outer boundary of the obround of the hemispherical end 308. It follows that the total distance D between straight sides 304 and 306 (measured perpendicular to the sides) is twice the radius of curvature 314. Again, hemispherical end 308 is representative of all the hemispherical ends.

FIG. 3 further shows a respective base region disposed within each internal region. Referring to internal region 300 as representative, the base region 110 is disposed within the internal region 300. The example base region 110 comprises a first end 316 associated with the hemispherical end 308, a second end 318 opposite the first end 316 and associated with the hemispherical end 310, and base length LB measured parallel to the straight sides 304 and 306. As shown, the example base region 110 is disposed within the obround with the base length LB parallel to and centered between the straight sides 304 and 306. In some cases, the outer-boundary 320 of the base region 110 is an outer boundary of the doped region that forms the base region 110. In the example shown, the outer boundary 320 of the base region 110 itself defines an obround with straight sides running parallel to each other, and with the ends 316 and 318 being rounded or hemispherical.

In accordance with various examples, the first end 316 is spaced apart from the hemispherical end 308 by a first gap G1 greater than the radius of curvature 314. Similarly, the second end 318 is spaced apart from the hemispherical end 310 by a second gap G2 greater than the radius of curvature 314. In some cases, the gaps G1 and G2 are about the same. Stated otherwise, in example cases the layout of the base region 110 is designed and constructed such that the ends 316 and 318 each have an interstice or gap greater than the radius of curvature that defines the hemispherical ends 308 and 310, respectively, and that gap is greater than the radius of curvature by more than a manufacturing tolerance for the device (e.g., greater than 1 micron). Assuming all the radii of curvature are the same length (not strictly required), and further assuming all the gaps are the same length (not strictly required), the gap may be at least 50% longer than the radius of curvature (e.g., gap=radius×1.5), in some cases 100% longer than the radius of curvature (e.g., gap=radius×2.0).

By using a gap greater than the radius of curvature of an associated hemispherical end, the electric field strength may be lower compared to having the gap being about equal to the radius of curvature. Moreover, lower electric field strength at the ends of the base region 110 (e.g., one micron beyond the boundary of the base region 110) may make the electric field strength about the same as the electric field strength along the straight sides of the outer boundary 320 of the base region 110. Lower electric field strength reduces the chances of breakdown starting at the ends of the base region 110, and reduces leakage current.

In some examples, addressing reverse-bias breakdown voltage using gaps alone may be sufficient. However, the inventors of the specification believe further factors may also contribute to less than expected reverse-bias breakdown—such as placement of the metallic contact associated with the example base region 110.

Figure 4:
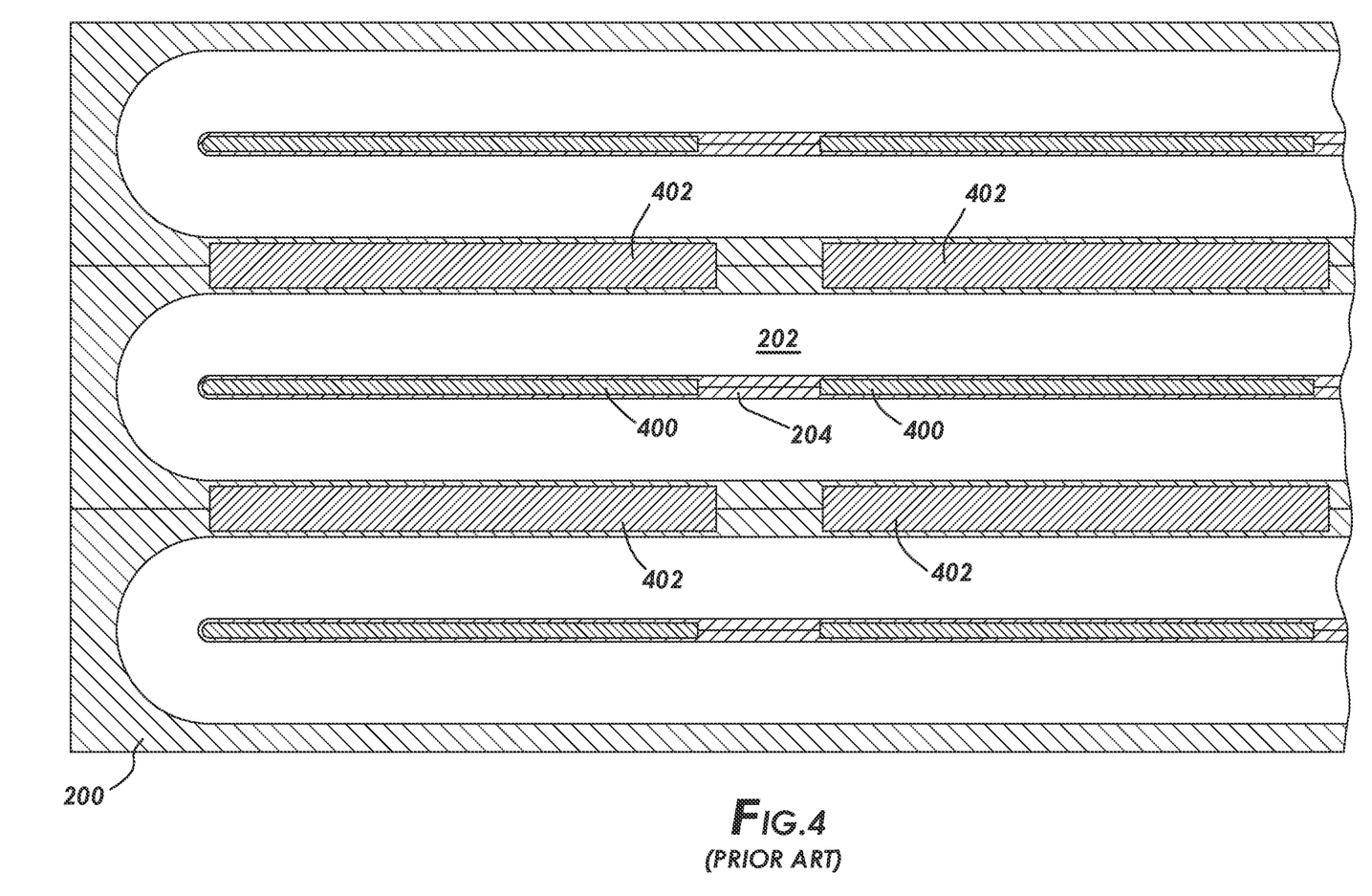
FIG. 4 shows an overhead view of the upper side of a semiconductor substrate during an intermediate stage of the construction of a related-art device.

FIG. 4 shows an overhead view of the upper side of a semiconductor substrate during an intermediate stage of the construction of related-art devices. In particular, visible in FIG. 4 is the emitter region 200, along with several internal regions that are not doped as emitter regions, such as the internal region 202. Defined within the example internal region 202 is the base region 204; however, the base region 204 is only partially visible in FIG. 4, as the base contacts 400 partially obscure the base region 204. Similarly, visible in FIG. 4 are several emitter contacts 402. In related-art devices, the separation S between the base region 204 and the surrounding emitter region 200 is uniform as shown. Moreover, the end of the base contact 400 closest to the hemispherical portion of the emitter region 200 has about the same separation S relative to the hemispherical portion of the emitter region 200. Stated otherwise, the separation S between the end of the base contact 400 and the associated hemispherical portion of the emitter region 200 is about the same as the separation S along the long dimension of the base contact 400 and the base region 204.

The inventors of the current specification believe that having the end of the base contact 400 being very close, if not coextensive, with the end of the base region 204 may contribute to the less than expected reverse-bias breakdown voltage. In particular, with the base contact 400 electrically coupled to the base region 204, charge carriers (e.g., electrons) injected into the base region 204 experience no appreciable voltage drop as the charge carriers propagate to the ends of the base region 204. The higher the voltage at the ends of the base region 204, the greater the electric field associated with current crowding at the ends of the base region. Moreover, the charge carriers in the metallic base contact 400 also create electric field with respect to the hemispherical portion of the emitter region 200, and while those charge carriers may not directly traverse the depletion region around the base region 204, the additional electric field may hasten the breakdown within the depletion region between the base region 204 and the emitter region 200.

Figure 5:
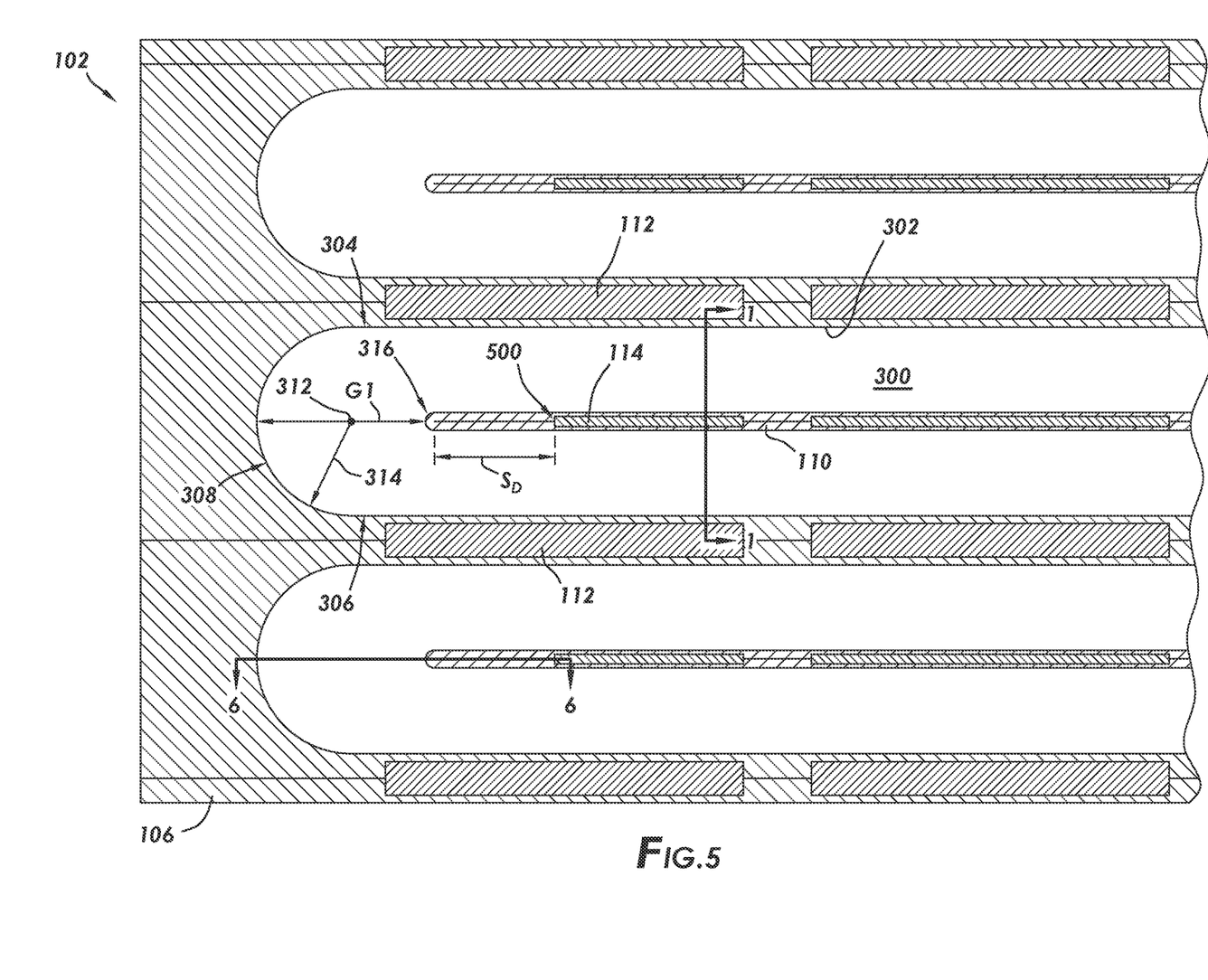
FIG. 5 shows an overhead view of the upper side of a semiconductor substrate during an intermediate stage of the construction, and in accordance with at least some embodiments.

FIG. 5 shows an overhead view of the upper side 102 of a semiconductor substrate during an intermediate stage of the construction, and in accordance with at least some embodiments. Again, showing the upper side 102 is arbitrary, as in symmetrical devices the upper side 102 and lower side 104 (FIG. 1) appear identical. For context, the cross-sectional view of FIG. 1 may be considered to have been taken along line 1-1 of FIG. 5, including the base and collector-emitter contacts.

In particular, visible in FIG. 5 is the collector-emitter region 106. The collector-emitter region 106 defines several internal regions that are not doped as collector-emitter regions, such as the example internal region 300. Each internal region 300 is defined by the inner boundary 302 of the collector-emitter region 106. As before, the inner-boundary 302 may be an internal boundary of the doped region that forms the collector-emitter region 106. And as before, the example inner boundary 302 defines the shape of an obround, including the straight sides 304 and 306 and an example hemispherical end 308. Referring to hemispherical end 308 as representative, the hemispherical end 308 defines the center of curvature 312 and the radius of curvature 314. That is to say, the radius of curvature 314 sweeps out and defines the outer boundary of the obround at the example hemispherical end 308. As in the prior examples, the first end 316 is spaced apart from the hemispherical end 308 by a first gap G1 greater than the radius of curvature 314. Stated otherwise, in example cases the layout of the base region 110 is designed and constructed such that the example end 316 has a gap G1 greater than the radius of curvature that defines the example hemispherical end 308.

Further visible in FIG. 5 are a plurality of base contacts, such as base contact 114. The example base contact 114 is disposed over and electrically coupled to the underlying base region 110. In particular, during manufacturing the collector-emitter region 106 and the base regions 110 may be constructed, and then a dielectric layer (e.g., oxide layer) may be grown or deposited over the entire upper side 102, though the dielectric layer is not specifically shown in FIG. 5 so as not to obscure the underlying regions. Using various photolithography and etching techniques, windows may be opened through the dielectric layer to expose the underlying collector-emitter region 106 and base regions 110. Then a metal layer may be sputtered or deposited over the upper side 102, and the metal thus electrically contacts the underlying regions. Again using various photolithography and etching techniques, much of the metal may be removed, leaving just the collector-emitter contacts 112 and the base contact 114 as shown in FIG. 5 (and the others not specifically numbered). The example base contact 114 defines a length parallel to the base length LB (FIG. 3), and a first terminus 500. The first terminus 500 is associated with the example first end 316 of the base region 110, and thus is associated with the example hemispherical end 308. More specifically the first terminus 500 is the closest terminus to the first end 316 of any base contact 114 coupled to a particular underlying base region 110. In the example shown, the base contact 114 and the related base contacts along the shared base region 110 are separated periodically, such as to reduce stresses associated with temperature-based differential expansion as between the metal layers and the semiconductor layers. However, in other cases the base contact may be a continuous structure along and over each respective base region 110.

In the example layout, the first terminus 500 is spaced apart from the first end 316 by a setback distance $S_D$ measured along the long dimension of the base region 110, and in some examples the setback distance $S_D$ is at least equal to the radius of curvature 314. Assuming all the radii of curvature are the same length (not strictly required), and further assuming all the setback distances are the same length (not strictly required), the setback distance $S_D$ for each base contact 114 may be at least fifty percent (50%) longer than the radius of curvature (e.g., setback=radius× 1.5), in some cases one hundred percent (100%) longer than the radius of curvature (e.g., setback=radius×2.0). Stated differently, measured parallel the long dimension of the base region, the sum of the gap G1 and setback distance $S_D$ may be at least 2.5 times the length of the radius of curvature 314.

By using a setback distance $S_D$ greater than the radius of curvature of an associated hemispherical end, the electric field strength may be lower compared to having base contact 114 being coextensive with base region 110. One possible explanation, and other explanations are possible, is that by having the base contact 114 with the setback distance $S_D$ as shown, the charge carriers (e.g., electrons) injected into the base region 110 by way of the base contact 114 experience a non-trivial voltage drop when propagating through the base region 110 toward the first end 316. The non-trivial voltage drop thus lowers the voltage at the first end 316, and consequently lowers the electrical field strength at the example first end 316 of the base region 110 (e.g., one micro-meter beyond the boundary of the base region 110). Moreover, the setback distance $S_D$ lowers any electric field contribution from charge carriers in the base contact 114 itself. Lower electric field strength reduces the chances of breakdown starting at the ends of the base region 110, and also reduced leakage current.

Figure 6:
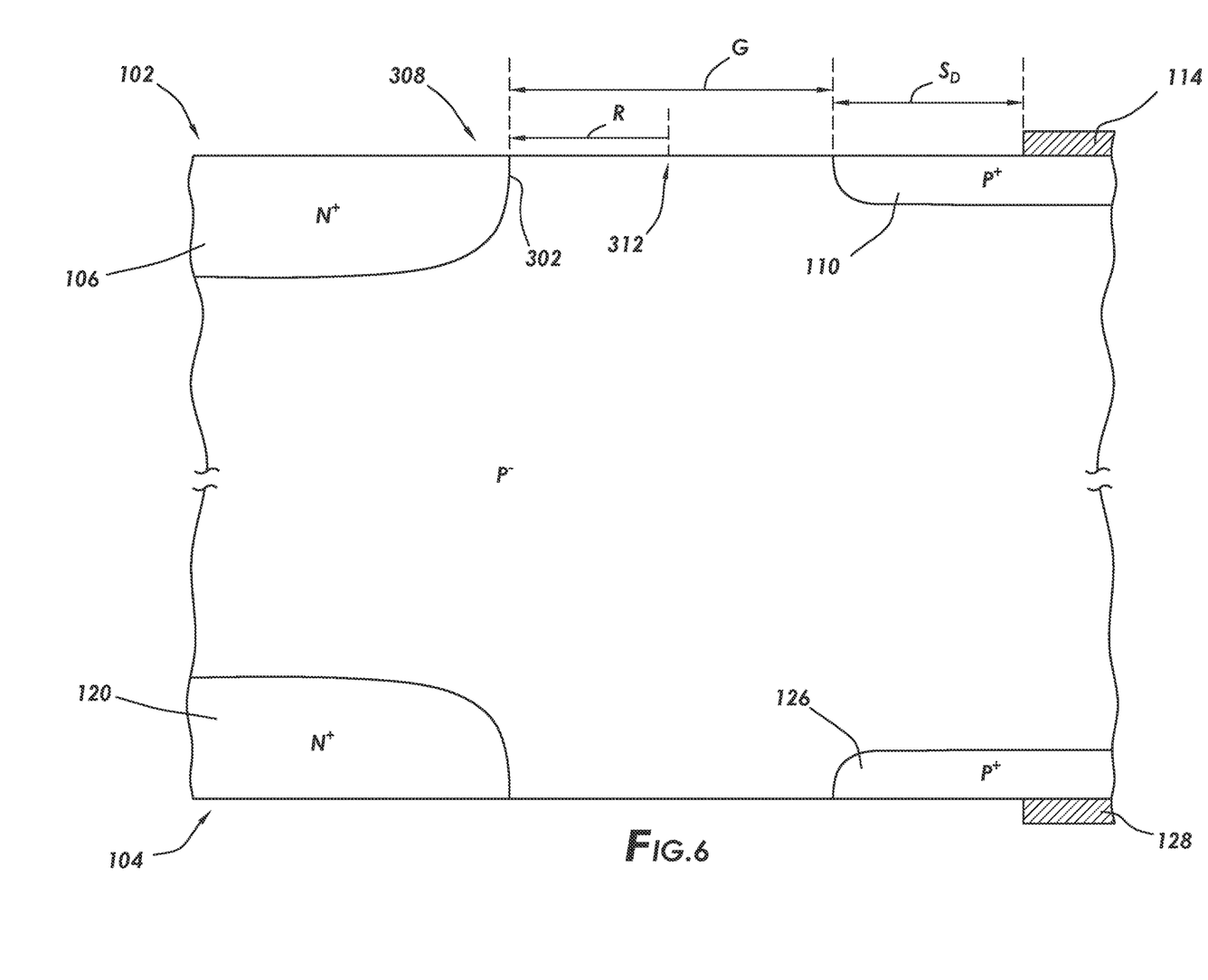
FIG. 6 shows a cross-sectional view taken substantially along line 6-6 of FIG. 5, in accordance with at least some embodiments.

FIG. 6 shows an example cross-sectional view taken substantially along line 6-6 of FIG. 5. In particular, FIG. 6 shows a portion of the collector-emitter region 106 on the upper side 102, along with a portion of the collector-emitter region 120 on the lower side 104. FIG. 6 further shows the inner boundary 302 associated with a hemispherical end 308. For purposes of discussion, assume that the center of curvature 312 is as marked, and thus the radius of curvature R extends between the center of curvature 312 and the inner boundary 302.

FIG. 6 further shows a portion the base region 110 and base contact 114 on the upper side 102, along with a portion of the base region 126 and base contact 128 on the lower side 104. FIG. 6 shows that in various examples the base regions, such as base region 110, may have a gap G greater than the radius of curvature R, and in the example shown the gap G is about twice the radius of curvature R. Moreover, FIG. 6 shows that in various examples the base contacts, such as base contact 114, may have a setback distance $S_D$ is at least equal to the radius of curvature R.

The various embodiments discussed to this point have assumed that, on each side of the device, the volume between the base regions and the collector-emitter regions comprises solely the P-type bulk substrate. However, in other cases additional structures may be present.

Figure 7:
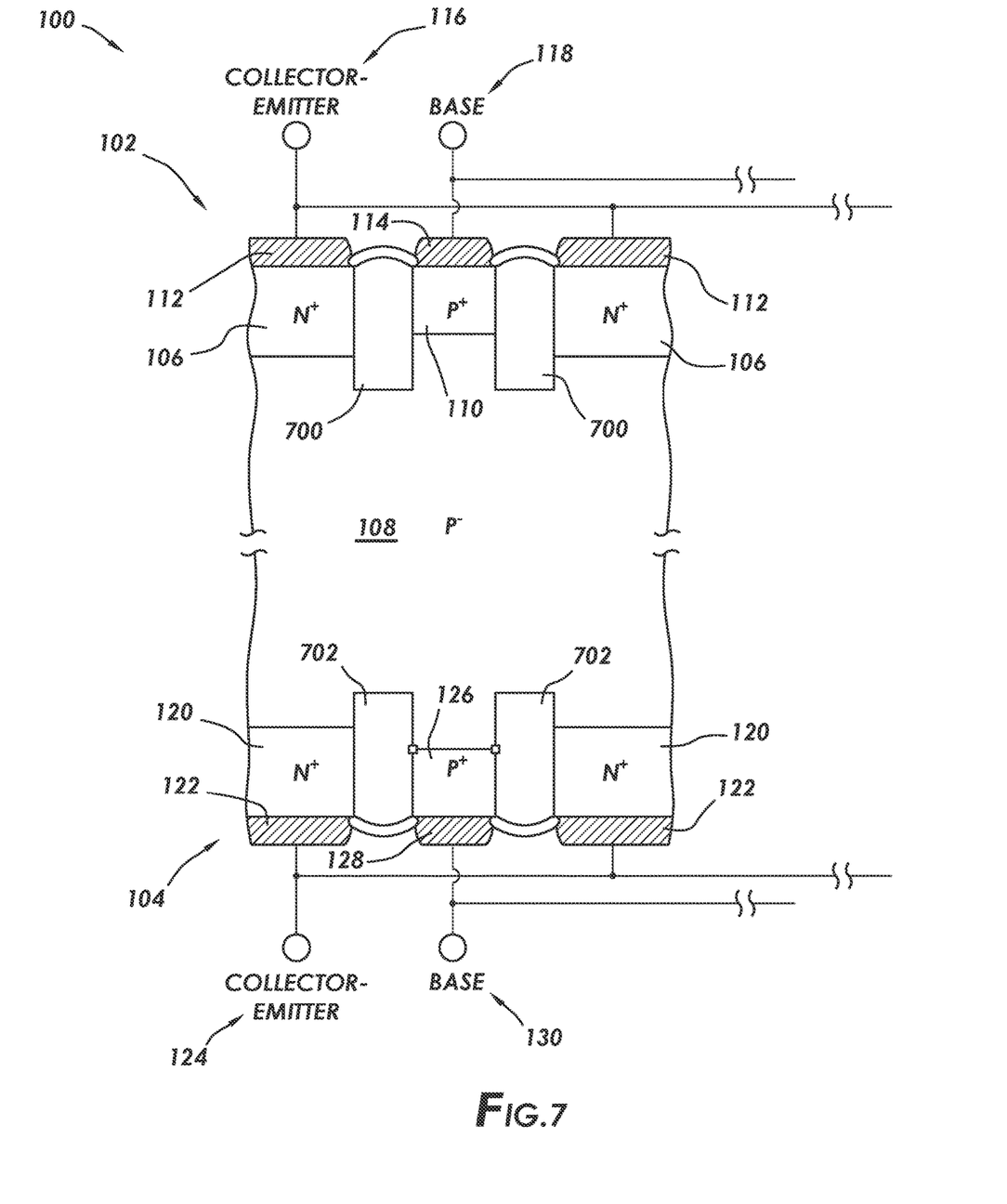
FIG. 7 shows a cross-sectional elevation view of a portion of B-TRAN in accordance with at least some embodiments.

FIG. 7 shows a partial cross-sectional, elevation view of an example B-TRAN. In particular, FIG. 7 shows a B-TRAN 100 having the upper side 102 and the lower side 104. The upper side 102 includes the collector-emitter regions 106 which form a junction with the drift region or bulk substrate 108. The upper side 102 further defines the base region 110 disposed between the collector-emitter regions 106. As before, the collector-emitter regions 106 are electrically coupled to the collector-emitter contacts 112.

Similarly, the base region 110 is electrically coupled to the base contact 114. In the view of FIG. 7, only two collector-emitter contacts 112 are shown, and only one base contact 114 is shown; however, in example systems two or more collector-emitter contacts 112 may be implemented, and two or more base contacts 114 may be implemented. The collector-emitter contacts 112 are coupled together to form an upper collector-emitter 116. The base contacts 114 are coupled together to form an upper base 118.

Similarly, the lower side 104 includes collector-emitter regions 120 which form a junction with the bulk substrate 108, and collector-emitter contacts 122 that electrically couple to the collector-emitter regions 120. The collector-emitter contacts 122 are coupled together to form the lower collector-emitter 124. The lower side 104 includes the base region 126 and the base contact 128 that electrically couples to the base region 126. The base contacts 128 are coupled together to form a lower base 130. As with FIG. 1, in FIG. 7 the example B-TRAN 100 is an NPN structure, so the collector-emitter regions 106 and 120 are N-type, the base regions 110 and 126 are P-type, and the bulk substrate 108 is P-type. Note that PNP-type B-TRAN devices are also contemplated; however, so as not to unduly lengthen the discussion a PNP-type B-TRAN device is not specifically shown.

Still referring to FIG. 7, the example B-TRAN 100 further comprises additional structures between the base regions and the collector-emitter regions. Referring initially to the upper side 102, trenches 700 reside between the base region 110 and the surrounding collector-emitter regions 106. In example cases, the trenches may have a depth of between and including 10 microns and 15 microns, though other trench depths are contemplated having sufficient depth to be "below" the bottoms of the respective regions. Further in example cases, the trenches 700 have a width of between and including 3 microns and 5 microns, though again larger and smaller widths are contemplated. In example cases, the trenches comprise a dielectric material (e.g., oxide) which electrically insulates the base regions 110 from the collector-emitter regions 106. The trenches 700 may be used together with the gaps and setbacks discussed above to improve or increase the reverse-bias breakdown voltage of the example B-TRAN 100 and reduces leakage current.

Similarly for the lower side 104, the example B-TRAN 100 comprises the additional structures between the base regions and the collector-emitter regions. In the example, trenches 702 reside between the base region 126 and the surrounding collector-emitter regions 120. As with upper side 102, the trenches 702 may have a depth of between and including 10 microns and 15 microns, and a width of between and including 3 microns and 5 microns. The example trenches are filled with a dielectric material (e.g., oxide) which electrically insulates the base regions 126 from the collector-emitter regions 120. The trenches 702 may be used together with the gaps and setbacks discussed above to improve or increase the reverse-bias breakdown voltage of the example B-TRAN 100 and reduces leakage current.

In the example cross-sectional view of FIG. 7, the trenches 700 and 702 span the volume between each base region and a surrounding collector-emitter region on the same side. However, in other cases the trenches 700 and 702 may span only a portion of the volume. In one example case, the trenches circumscribe and abut or closely abut the base regions, and thus additional depletion region may extend from an outside surface of each trench to the surrounding collector-emitter regions.

The above discussion is meant to be illustrative of the principles and various embodiments of the present invention. Numerous variations and modifications will become apparent to those skilled in the art once the above disclosure is fully appreciated. For example, the various structures can be implemented for any semiconductor device with inter-digitated structure. It is intended that the following claims be interpreted to embrace all such variations and modifications.

What is claimed is:
1. A semiconductor device comprising:
    an emitter region defining an inner boundary in the shape of an obround with parallel sides, and the obround having a first hemispherical end and a second hemispherical end each having a radius;

a base region having a first end, a second end opposite the first end, and base length, the base region disposed within the obround with the base length parallel to and centered between the parallel sides, the first end spaced apart from the first hemispherical end by a first gap greater than the radius by more than a manufacturing tolerance, and the second end spaced apart from the second hemispherical end by a second gap greater than the radius by more than the manufacturing tolerance.

2. A semiconductor device comprising:
an emitter region defining an inner boundary in the shape of an obround with parallel sides, and the obround having a first hemispherical end and a second hemispherical end each having a radius;
a base region having a first end, a second end opposite the first end, and base length, the base region disposed within the obround with the base length parallel to and centered between the parallel sides, the first end spaced apart from the first hemispherical end by a first gap greater than the radius by more than a manufacturing tolerance, and the second end spaced apart from the second hemispherical end by a second gap greater than the radius by more than the manufacturing tolerance;
a base contact electrically coupled to the base region through a base window through a dielectric, the base contact defines a length parallel to the base length, and a first terminus being a closest terminus to the first end, the first terminus spaced apart from the first end by a setback distance being at least equal to the radius.

3. The semiconductor device of claim 1 wherein the first gap is at least fifty percent (50%) longer than the radius.

4. The semiconductor device of claim 1 wherein the first gap is at least one hundred percent (100%) longer than the radius.

5. The semiconductor device of claim 2 wherein the setback distance is at least fifty percent (50%) longer than the radius.

6. The semiconductor device of claim 2 wherein the setback distance is at least one hundred percent (100%) longer than the radius.

7. The semiconductor device of claim 1 further comprising:
a lower side comprising an emitter region and a base region;
the semiconductor device defines a bidirectional double-base bipolar junction transistor.

8. The semiconductor device of claim 1 further comprising wherein the base region is P-type, and the emitter region is N-type.

9. The semiconductor device of claim 1 further comprising a trench of dielectric material surrounding the base region.

10. The semiconductor device of claim 9 wherein the trench has a depth of 10 microns to 15 microns, inclusive, and a width of 3 microns to 5 microns, inclusive.

11. A semiconductor device comprising:
an emitter region defining an inner boundary in the shape of an obround with parallel sides, and the obround having first and second hemispherical ends each having a radius;
a base region having a first end, a second end opposite the first end, and base length, the base region disposed within the obround with the base length parallel to and centered between the parallel sides, the first end spaced apart from the first hemispherical end by a first gap, and the second end spaced apart from the second hemispherical end by a second gap;
a base contact electrically coupled to the base region, the base contact defines a length parallel to the base length, and a first terminus being a closest terminus to the first end, the first terminus spaced apart from the first end by a setback distance being at least equal to the radius.

12. The semiconductor device of claim 11 wherein the setback distance is at least fifty percent (50%) longer than the radius.

13. The semiconductor device of claim 11 wherein the setback distance is at least one hundred percent (100%) longer than the radius.

14. The semiconductor device of claim 11 further comprising the first gap greater than the radius by more than a manufacturing tolerance, and the second gap greater than the radius by more than a manufacturing tolerance.

15. The semiconductor device of claim 14 wherein the first gap is at least fifty percent (50%) longer than the radius.

16. The semiconductor device of claim 14 wherein the first gap is at least one hundred percent (100%) longer than the radius.

17. The semiconductor device of claim 11 further comprising:
a lower comprising an emitter region and a base region;
the semiconductor device defines a bidirectional double-base bipolar junction transistor.

18. The semiconductor device of claim 11 further comprising wherein the base region is P-type, and the emitter region is N-type.

19. The semiconductor device of claim 11 further comprising a trench of dielectric material surrounding the base region.

20. The semiconductor device of claim 19 wherein the trench has a depth of 10 microns to 15 microns, inclusive, and a width of 3 microns to 5 microns, inclusive.

* * * * *